(12) United States Patent
Deeman et al.

(10) Patent No.: US 10,600,354 B2
(45) Date of Patent: Mar. 24, 2020

(54) SMALL PITCH DIRECT VIEW DISPLAY AND METHOD OF MAKING THEREOF

(71) Applicant: GLO AB, Lund (SE)

(72) Inventors: Neil Deeman, Danville, CA (US); Michael Jansen, Palo Alto, CA (US); Hyung-Chul Lee, Fremont, CA (US); Kai Liu, Dublin, CA (US); Kazunori Okui, Newark, CA (US)

(73) Assignee: GLO AB, Lund (SE)

( * ) Notice: Subject to any disclaimer, the term of this patent is extended or adjusted under 35 U.S.C. 154(b) by 0 days.

(21) Appl. No.: 15/493,787

(22) Filed: Apr. 21, 2017

(65) Prior Publication Data

US 2017/0309223 A1 Oct. 26, 2017

Related U.S. Application Data

(60) Provisional application No. 62/326,255, filed on Apr. 22, 2016.

(51) Int. Cl.
| | |
|---|---|
| *H05K 3/28* | (2006.01) |
| *G09G 3/32* | (2016.01) |
| *H05K 1/02* | (2006.01) |
| *H05K 1/18* | (2006.01) |
| *H05K 3/30* | (2006.01) |

(52) U.S. Cl.
CPC ............. *G09G 3/32* (2013.01); *H05K 1/0274* (2013.01); *H05K 1/181* (2013.01); *H05K 3/28* (2013.01); *H05K 3/284* (2013.01); *H05K 3/303* (2013.01); *G09G 2300/0408* (2013.01); *G09G 2300/0452* (2013.01); *H05K 2201/0112* (2013.01); *H05K 2201/10106* (2013.01);

(Continued)

(58) Field of Classification Search
CPC ........... H05K 3/303; H05K 2203/1316; H05K 2201/0112; G09G 3/32; G09G 3/3208; G09G 3/3216; G09G 3/3225; G09G 3/3233; G09G 3/3241; G09G 3/325; G09G 3/3258; G09G 3/3266; G09G 3/3275; G09G 3/3283; G09G 3/3291
USPC ........................................................ 313/500
See application file for complete search history.

(56) References Cited

U.S. PATENT DOCUMENTS

| 7,335,908 B2 | 2/2008 | Samuelson et al. |
| 7,396,696 B2 | 7/2008 | Kim et al. |

(Continued)

FOREIGN PATENT DOCUMENTS

| EP | 2 293 354 A1 | 3/2011 |
| JP | 2004022245 A | 1/2004 |

(Continued)

OTHER PUBLICATIONS

International Search Report and Written Opinion of the International Searching Authority for International Application No. PCT/US2014/056811, dated Jan. 26, 2015.

(Continued)

*Primary Examiner* — Christopher M Raabe
(74) *Attorney, Agent, or Firm* — The Marbury Law Group, PLLC

(57) ABSTRACT

A direct view display device includes a printed circuit board, an array of pixels located on a first side of the printed circuit board, each pixel including a plurality of light emitting diodes, and an isolation grid comprising a light absorbing material located between the pixels in the array of pixels.

20 Claims, 4 Drawing Sheets

(52) U.S. Cl.
CPC .............. *H05K 2201/10128* (2013.01); *H05K 2203/1316* (2013.01)

(56) References Cited

U.S. PATENT DOCUMENTS

| | | | |
|---|---|---|---|
| 7,829,443 | B2 | 11/2010 | Seifert et al. |
| 8,419,986 | B2 | 4/2013 | Gourlay |
| 9,281,442 | B2 | 3/2016 | Romano et al. |
| 2003/0174492 | A1 | 9/2003 | Ohkawa |
| 2004/0061810 | A1 | 4/2004 | Lowery et al. |
| 2004/0169786 | A1 | 9/2004 | Yamazaki et al. |
| 2005/0225238 | A1* | 10/2005 | Yamazaki .............. H01L 27/322 313/506 |
| 2007/0147076 | A1 | 6/2007 | Weber et al. |
| 2007/0253216 | A1 | 11/2007 | Watanabe |
| 2008/0144333 | A1 | 6/2008 | Gourlay |
| 2008/0266900 | A1 | 10/2008 | Harbers et al. |
| 2009/0128781 | A1 | 5/2009 | Li |
| 2009/0135315 | A1 | 5/2009 | Endo et al. |
| 2009/0147497 | A1 | 6/2009 | Nada |
| 2009/0303410 | A1 | 12/2009 | Murata et al. |
| 2010/0007268 | A1* | 1/2010 | Kim .................... H01L 27/3227 313/504 |
| 2010/0025700 | A1 | 2/2010 | Jung et al. |
| 2010/0073597 | A1 | 3/2010 | Bierhuizen et al. |
| 2011/0037728 | A1 | 2/2011 | Gourlay |
| 2011/0044073 | A1 | 2/2011 | Gourlay |
| 2013/0100695 | A1 | 4/2013 | Yankov et al. |
| 2013/0105203 | A1* | 5/2013 | Lee ........................ H01L 51/003 174/254 |
| 2013/0258216 | A1 | 10/2013 | Shiue et al. |
| 2014/0021493 | A1 | 1/2014 | Andrews et al. |
| 2014/0103809 | A1* | 4/2014 | Bang .................... H01L 51/529 315/113 |
| 2014/0339521 | A1* | 11/2014 | Ozawa ................ H01L 51/5228 257/40 |
| 2014/0367633 | A1 | 12/2014 | Bibl et al. |
| 2015/0069429 | A1 | 3/2015 | Ray et al. |
| 2015/0085521 | A1 | 3/2015 | Wang et al. |
| 2015/0085524 | A1 | 3/2015 | Wang et al. |
| 2015/0371573 | A1* | 12/2015 | Choi .................... H01L 51/5284 345/206 |
| 2016/0043061 | A1 | 2/2016 | Rhee |

FOREIGN PATENT DOCUMENTS

| | | |
|---|---|---|
| JP | 2007234412 A | 9/2007 |
| JP | 2011065010 A | 3/2011 |
| JP | 2011146238 A | 7/2011 |
| KR | 20080077220 A | 8/2008 |
| KR | 20120035062 A | 4/2012 |
| KR | 20150093284 A | 8/2015 |
| KR | 1020150094733 A | 8/2015 |
| WO | WO 2006/131924 A2 | 12/2006 |
| WO | WO 2007/102781 A1 | 9/2007 |
| WO | WO 2008/048704 A2 | 4/2008 |
| WO | WO2009133870 A1 | 11/2009 |
| WO | WO 2010/014032 A1 | 2/2010 |
| WO | WO 2011/148171 A2 | 12/2011 |
| WO | WO 2011/148173 A2 | 12/2011 |
| WO | WO2014030830 A1 | 2/2014 |
| WO | WO2015117273 A1 | 8/2015 |
| WO | WO 2016/025397 A2 | 2/2016 |
| WO | WO2016057588 A2 | 4/2016 |

OTHER PUBLICATIONS

International Search Report and Written Opinion of the International Searching Authority for International Application No. PCT/US2014/068782, dated Apr. 9, 2015.
International Preliminary Report or Patentability and Written Opinion of the International Searching Authority for International Application No. PCT/US2014/056811 dated Apr. 7, 2016, 16 pages.
International Preliminary Report or Patentability and Written Opinion of the International Searching Authority for International Application No. PCT/US2014/068782 dated Jun. 23, 2016, 10 pages.
International Search Report and Written Opinion of the International Searching Authority for International Application No. PCT/US2015/044488 dated Nov. 19, 2015, 16 pages.
The International Search Report and Written Opinion of the International Searching Authority for International Application No. PCT/US2016/062248, dated Feb. 27, 2017, 13 pages.
The International Search Report and Written Opinion of the International Searching Authority for International Application No. PCT/US2016/062251, dated Feb. 27, 2017, 13 pages.
U.S. Appl. No. 15/236,760, filed Aug. 15, 2016, GLO AB.
U.S. Appl. No. 15/353,050, filed Nov. 16, 2016, GLO AB.
U.S. Appl. No. 15/353,100, filed Nov. 16, 2016, GLO AB.
International Search Report and Written Opinion of the International Searching Authority for International Patent Application No. PCT/US2017/028771, dated Aug. 11, 2017, 12 pages.
International Preliminary Report on Patentability and Written Opinion of the International Searching Authority for International Patent Application No. PCT/US2017/028771, dated Nov. 1, 2018, 8 pages.
European Office Communication, along with Extended European Search Report and European Search Opinion for European Patent Application No. 17786687.8, dated Nov. 15, 2019, 6 pages.

* cited by examiner

FIG. 1A
FIG. 1B
FIG. 1C
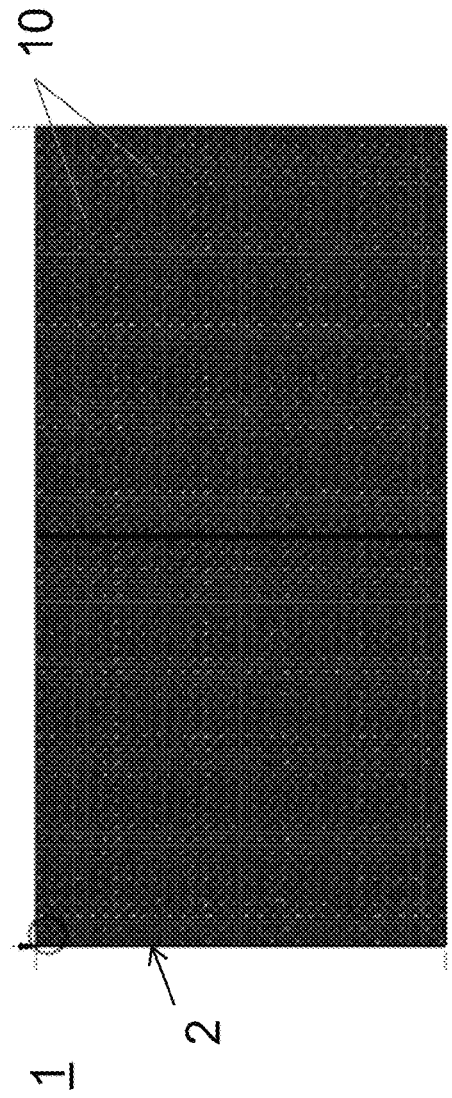
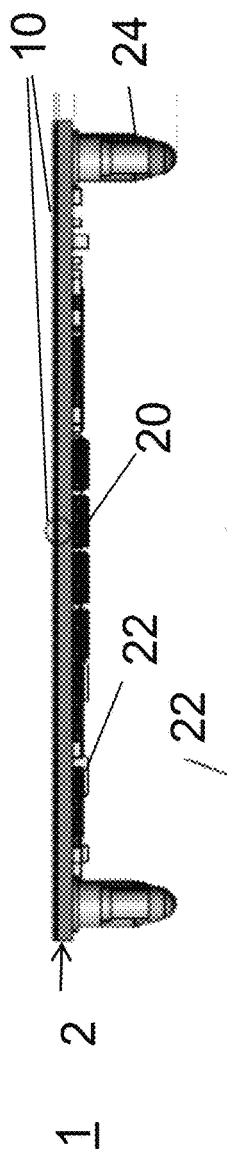
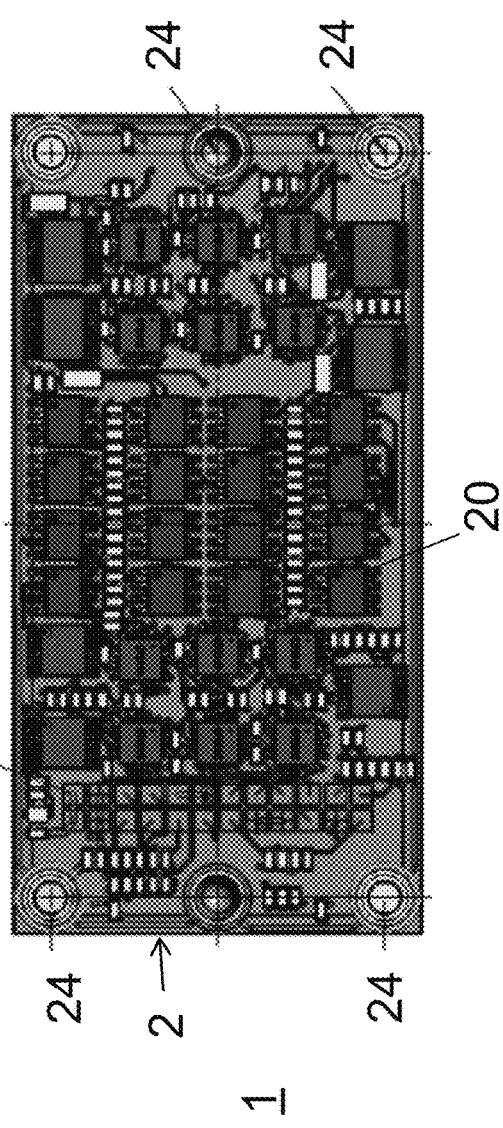

SMALL PITCH DIRECT VIEW DISPLAY AND METHOD OF MAKING THEREOF

RELATED APPLICATIONS

This application claims the benefit of priority from U.S. Provisional Application Ser. No. 62/326,255 filed on Apr. 22, 2016, the entire contents of which are incorporated herein by reference.

FIELD

The present disclosure relates to direct view display devices, and particularly to LED based small pitch direct display devices with an isolation grid and methods of fabricating the same.

BACKGROUND

A LED (light emitting diode) based direct view display is a display in which the LEDs are arranged in pixels and the image of the display is formed by turning the LEDs in each pixel on and off. This type of device differs from a LED backlit liquid crystal display (LCD) in which the pixels contain a liquid crystal material which is backlit by light (e.g., white light) emitted by a LED backlight.

SUMMARY

According to an aspect of the present disclosure, a direct view display device includes a printed circuit board, an array of pixels located on a first side of the printed circuit board, each pixel including a plurality of light emitting diodes, and an isolation grid comprising a light absorbing material located between the pixels in the array of pixels.

According to another aspect of the present disclosure, a method of forming a direct view display device comprises providing a printed circuit board, attaching light emitting diodes to a first side of the printed circuit board to form an array of pixels, each pixel comprising a plurality of light emitting diodes, and providing an isolation grid comprising a light absorbing material between the pixels in the array of pixels.

BRIEF DESCRIPTION OF THE DRAWINGS

FIGS. 1A, 1B and 1C are respective top, side and bottom views of a direct view display device according to an embodiment of the present disclosure.

FIGS. 4A and 4B are bottom views, FIG. 4C is a top view and FIG. 4D is a perspective view of the display device.

DETAILED DESCRIPTION

According to an aspect of the present disclosure, a LED based small pitch direct view display device including an isolation grid is provided. The direct view display device may be a multi-color or black and white display device which contains a red light emitting LED, blue light emitting LED and a green light emitting LED (i.e., RGB LEDs) in each pixel. In one embodiment, the pixels preferably contain no liquid crystal material. The pitch of the LED pixels is preferably less than 1.5 mm, such as 5 microns to 1.2 mm. For example, the display device with a pixel pitch of 0.9 to 1.2 mm can be used for electronic display signage applications, the display device with a pixel pitch of 50 microns to 1.2 mm can be used in electronic device displays, such as tablet, phone or watch displays, and the display device with a pixel pitch of 5 microns to 10 microns can be used for virtual reality or augmented reality devices (e.g., such as virtual reality goggles).

A LED based direct view device 1 of an embodiment of the present disclosure is shown in FIGS. 1A-1C. The device 1 contains a substrate 2, such as a printed circuit board (PCB). The LEDs 10, such as RGB LEDs, are mounted on the top surface of the substrate 2. Driver electronics 20, such as logic and/or control chips, contact pads 22 and electrodes (e.g., electrical contacts or pins) 24 are mounted on the bottom side of the substrate 2.

Figure 2A:
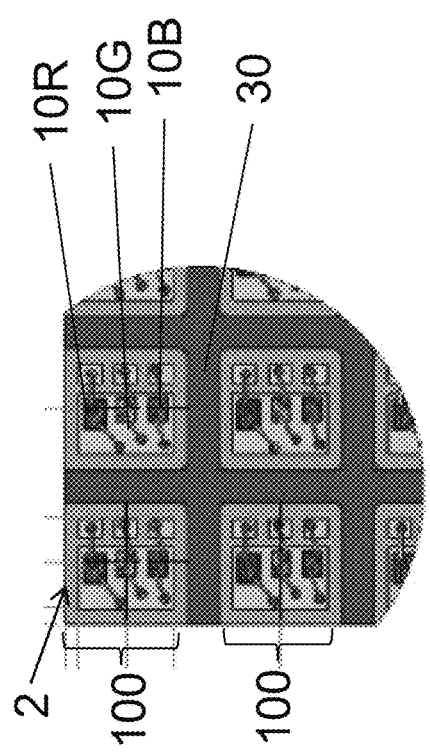
FIGS. 2A and 2B are respective magnified top view and side cross sectional view of the direct view display device of an embodiment of the present disclosure.
Figure 2B:
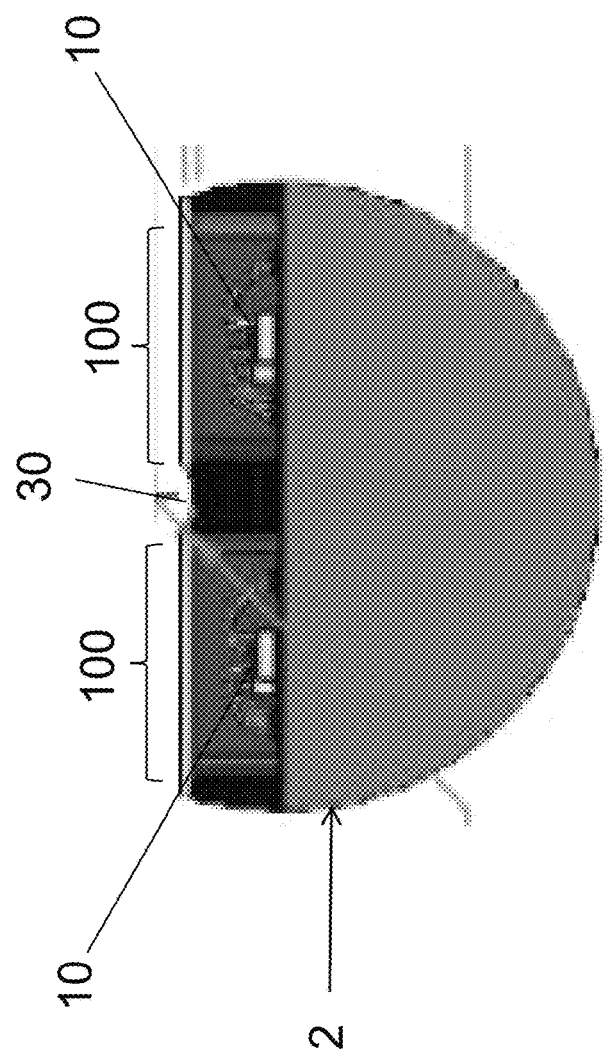
Figure 3:
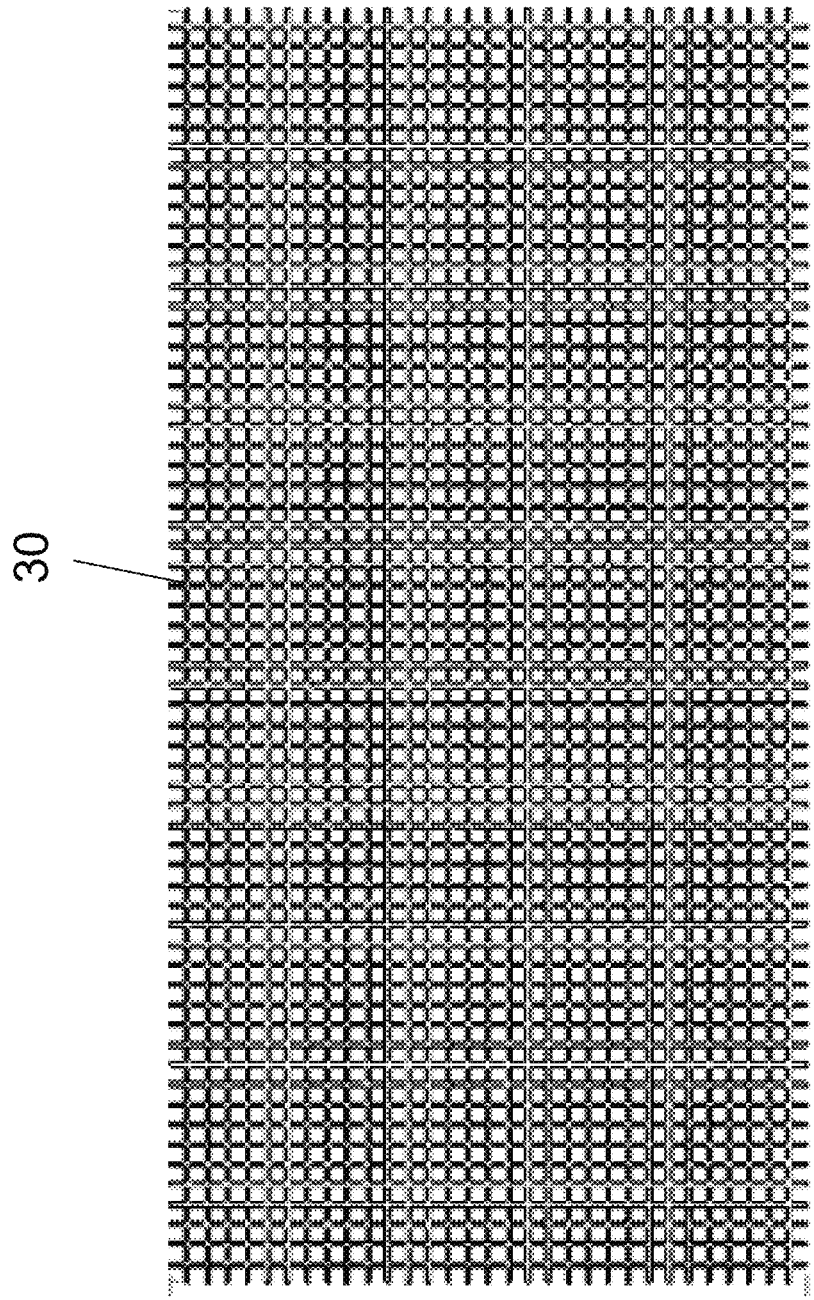
FIG. 3 is a top view of an isolation grid that provides lateral optical isolation according to an embodiment of the present disclosure.

In one embodiment of the present disclosure, an isolation grid 30 of light absorbing material can be provided between the pixels 100 of the device 1, as illustrated in FIGS. 2A, 2B and 3. Each pixel 100 may contain a red light emitting LED 10R, blue light emitting LED 10B and a green light emitting LED 10G. More than one LED 10 of one or more colors may be provided in each pixel 100. Each pixel 100 may also contain electrical contacts, sensor devices, and other electronics as needed.

The isolation grid 30 significantly reduces the optical interference between adjacent pixels (e.g., RGB pixels) 100. In one embodiment shown in FIG. 2B, the top of the isolation grid can be at least at the same level as (i.e., at the same level or protrude above) the top of the LEDs 10. In one embodiment, the top of the isolation grid can protrude above the plane including the topmost surfaces of the LED 10 dies.

In one embodiment, the isolation grid 30 can be applied before or after the LEDs 10 are mounted on the substrate 2, such as the printed circuit board (PCB). In one embodiment, the isolation grid 30 can be manufactured employing two-dimensional (2D) printing or three-dimensional (3D) printing using ultraviolet (UV) curable or thermal applied material directly onto the PCB surface. In one embodiment, the isolation material of the isolation grid can be a black UV curable ink.

In another embodiment, the isolation grid 30 can be manufactured by injection molding a plastic material to form a free-standing isolation grid, as shown in FIG. 3, and subsequently attaching the free-standing grid to the top PCB substrate 2 surface. In one embodiment, the isolation material of the isolation grid can be a black colored polycarbonate plastic material. FIG. 3 shows an exemplary criss-cross pattern that can be employed for the isolation grid 30. In one embodiment, the isolation grid 30 has a rectangular array of openings therein. In another embodiment, the isolation grid 30 has a hexagonal array of openings therein.

The isolation grid 30 containing direct view display devices 1 of the present disclosure provide improvement over prior art display devices. Optical interference from adjacent LED pixels 100, which would result in light emission from an apparently larger region than the physical area of the LED pixel 100 provided by design, can be significantly reduced. Reduction of optional interference has the effect of enhancing the optical resolution of the display device.

Figure 4A:
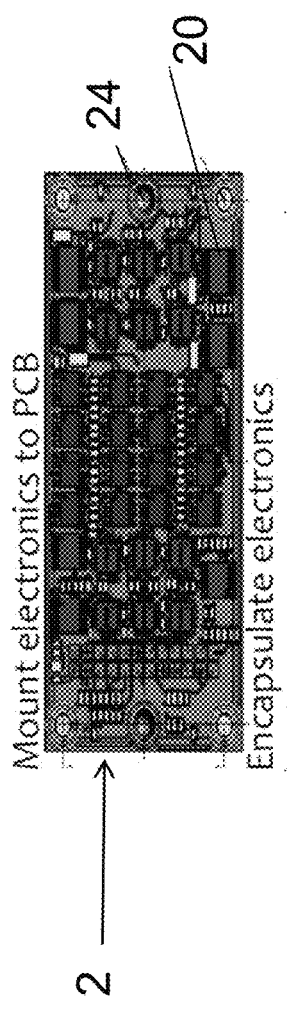
FIGS. 4A-4D show steps in a manufacturing sequence that can be employed to fabricate a direct view display device of the present disclosure.
Figure 4B:
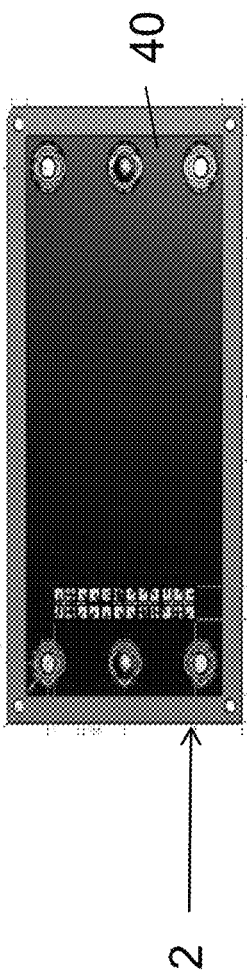

FIGS. 4A to 4D illustrate an exemplary process sequence that may be employed to manufacture the direct view display device 1 of the present disclosure. As shown in FIG. 4A, the electronic components (20, 22, 24) are mounted to the bottom side of the PCB substrate 2 in a first step. The electronic components are then encapsulated in a planarizing encapsulation material which forms a bottom encapsulation layer 40 in a second step, as shown in FIG. 4B. The planarizing encapsulation material of the bottom encapsulation layer 40 can include, e.g. Bakelite or epoxy molding compound (EMC). The planarizing encapsulation material 40 is compatible with the third and fourth steps described below. The thickness of the bottom encapsulation layer 40 can be in a range from 30 microns to 10 mm, although lesser and greater thicknesses can also be used.

Figure 4C:
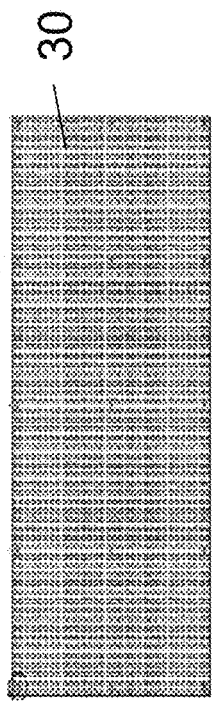

A third step of mounting the LEDs 10 and forming the isolation grid 30 on the top side of the substrate 2 is then performed, as shown in FIG. 4C. For example, the LEDs 10 can be mounted to the top side of the substrate 2 in a pixel arrangement, followed by printing a UV or thermally curable ink between the pixels 100. The ink in then UV cured or thermally cured to form the isolation grid 30. Alternatively, the free-standing isolation grid 30 can be formed separately from the substrate 2 followed by attaching the free-standing isolation grid 30 to the top side of the substrate 2 before or after mounting the LEDs 10.

Figure 4D:
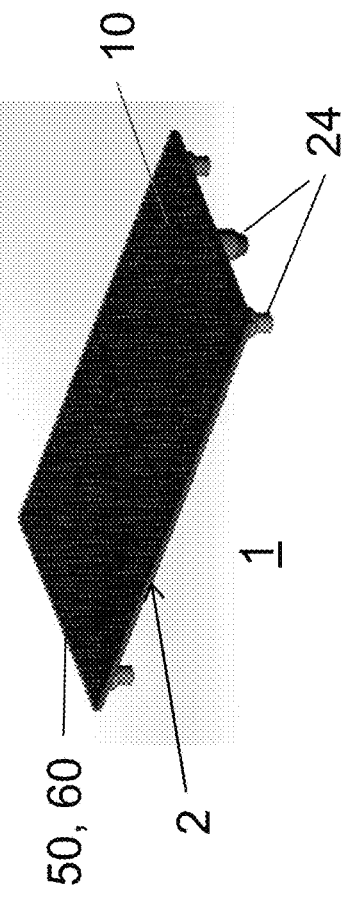

In a fourth step, a top encapsulation layer 50 is formed on the LEDs 10 and the isolation grid 30 over the top side of the substrate 2, as shown in FIG. 4D. The second encapsulation process of the fourth step is aided by the presence of the bottom encapsulation layer 40 formed in the second step such that the pressure exerted on the PCB substrate 2 is more evenly distributed during the fourth step, thereby preventing cracking, bending or other damage to the assembly.

According to another embodiment of the present disclosure, a relatively thin transparent coating layer 60 can be formed over the top encapsulation layer 50. The thickness of the top encapsulation layer 50 can be in a range from 30 microns to 1 mm, although lesser and greater thicknesses can also be used. The thickness of the second encapsulation layer 60 can be in a range from 10 microns to 300 microns, although lesser and greater thicknesses can also be employed.

Encapsulation materials that can be used for the top encapsulation layer 50 can be optically transparent silicones. The surface properties of these types of materials lend themselves to easy pick up of contamination from fingerprints and dust that can impair the optical transmission. This surface can be modified by the application of the transparent coating layer 60 that is thinner than top encapsulation layer 50, binds strongly to the second encapsulation layer 50, and is resistant to contamination build up. An example of such a material for layer 60 is a contamination-resistant material, such as KJC-7022 made by Shin Etsu Chemical. This material does not have the required properties to replace the LED encapsulant entirely but can modify the surface properties sufficiently to have the desired effect. Thus, a stack of a transparent top encapsulation layer 50 and a transparent coating layer 60 made from a material resistant to surface contamination can be employed to enhance display properties of a direct view display device.

Thus, the electronic components (20, 22, 24) which are mounted to the bottom surface of the PCB substrate 2 are protected from damage by the bottom encapsulation layer 40 during the mounting of the LEDs 10 and formation of the isolation grid 30 on the top side of the substrate 2 and during the product life. Furthermore, the top, outer viewable surface of the device 1 is protected from build-up of contamination (e.g., finger prints, dust etc.) that can reduce light output, and can be cleaned to return it to its original optical output due to the presence of the transparent coating layer 60.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The invention claimed is:

1. A direct view display device comprising:
   a printed circuit board;
   an array of pixels located on a first side of the printed circuit board, each pixel comprising a plurality of light emitting diodes (LEDs);
   an isolation grid comprising a light absorbing material located between the pixels in the array of pixels, wherein the isolation grid contacts and is attached to a top surface of the printed circuit board; and
   further comprising a first transparent encapsulation material layer located over the isolation grid and the array of pixels.

2. The direct view display device of claim 1, further comprising a contamination-resistant transparent coating layer located on the first transparent encapsulation material and comprising a material that is more resistant to pick-up of contaminants than the transparent encapsulation material layer.

3. The direct view display device of claim 1, further comprising:
   driver electronics mounted on a second side of the printed circuit board; and
   a second encapsulation material layer located over the driver electronics.

4. The direct view display device of claim 1, wherein each pixel comprises a red light emitting LED, a blue light emitting LED and a green light emitting LED.

5. The direct view display device of claim 1, wherein the isolation grid extends at least up to a height of a topmost surface of the array of pixels.

6. The direct view display device of claim 1, wherein the isolation grid comprises a free-standing grid made of a plastic light absorbing material.

7. The direct view display device of claim 6, wherein the light absorbing material comprises a black colored polycarbonate plastic material.

8. The direct view display device of claim 1, wherein the isolation grid comprises a printed UV curable or thermally applied material.

9. The direct view display device of claim 8, wherein the light absorbing material comprises a printed and UV cured black ink.

10. A method of forming a direct view display device, comprising:
    providing a printed circuit board;
    attaching light emitting diodes (LEDs) to a first side of the printed circuit board to form an array of pixels, each pixel comprising a plurality of the LEDs;
    providing an isolation grid comprising a light absorbing material between the pixels in the array of pixels by attaching the isolation grid directly to a top surface of the printed circuit board located on the first side prior to, or after, attaching the LEDs; and further comprising forming a first transparent encapsulation material layer over the isolation grid and the array of pixels.

11. The method of claim 10, further comprising forming contamination-resistant transparent coating layer on the first transparent encapsulation material, the contamination-resistant transparent coating layer comprising a material that is more resistant to pick-up of contaminants than the transparent encapsulation material layer.

12. The method of claim 10, further comprising:
providing driver electronics and the printed circuit board;
mounting the provided driver electronics on a second side of the provided printed circuit board; and
forming a second encapsulation material layer over the driver electronics prior to attaching the light emitting diodes to the first side of the printed circuit board.

13. The method of claim 10, wherein each pixel comprises a red light emitting LED, a blue light emitting LED and a green light emitting LED.

14. The method of claim 10, wherein the isolation grid extends at least up to a height of a topmost surface of the array of pixels.

15. The method of claim 10, wherein providing the isolation grid comprises forming a free-standing isolation grid made of a plastic light absorbing material and attaching the free-standing isolation grid to the first side of the printed circuit board.

16. The method of claim 15, wherein the light absorbing material comprises injection molded, black colored polycarbonate plastic material.

17. The method of claim 10, wherein providing the isolation grid comprises printing a UV curable or thermally applied material between the pixels on the first side of the printed circuit board.

18. The method of claim 17, wherein the light absorbing material comprises a printed, UV curable black ink which is UV cured after being printed.

19. A direct view display device comprising:
a printed circuit board;
an array of pixels located on a first side of the printed circuit board, each pixel comprising a plurality of light emitting diodes (LEDs);
an isolation grid comprising a light absorbing material located between the pixels in the array of pixels, wherein the isolation grid extends at least up to a height of a topmost surface of the LEDs in the array of pixels; and
a first transparent encapsulation material layer located over the isolation grid and the array of pixels.

20. The direct view display device of claim 19, wherein the isolation grid is located between sides of the pixels and extends to the height of the topmost surface of the array of pixels as well as above the height of the topmost surface of the array of pixels.

* * * * *